United States Patent [19]
Turney et al.

[11] Patent Number: 5,584,059
[45] Date of Patent: Dec. 10, 1996

[54] DC OFFSET REDUCTION IN A ZERO-IF TRANSMITTER

[75] Inventors: William J. Turney, Schaumburg; Paul H. Gailus, Prospect Heights, both of Ill.

[73] Assignee: Motorola, Inc., Schaumburg, Ill.

[21] Appl. No.: 85,439

[22] Filed: Jun. 30, 1993

[51] Int. Cl.$^6$ ............................................. H04B 1/04
[52] U.S. Cl. .................... 455/126; 455/115; 455/324; 375/296
[58] Field of Search ................................. 455/109, 126, 455/119, 116, 209, 113, 115, 117, 127, 110, 324; 330/9, 261, 296; 375/301, 296, 317

[56] References Cited

U.S. PATENT DOCUMENTS

| | | | |
|---|---|---|---|
| 4,554,511 | 11/1985 | Brann | 330/9 |
| 4,557,159 | 3/1986 | Pace | 330/9 |
| 4,633,223 | 12/1986 | Senderowicz | 330/9 |
| 4,811,425 | 3/1989 | Feerst | 455/209 |
| 4,933,986 | 6/1990 | Leitch | 455/126 |
| 5,021,753 | 6/1991 | Chapman | 455/126 |
| 5,162,763 | 11/1992 | Morris | 455/109 |
| 5,175,879 | 12/1992 | Ellingson et al. | 455/126 |
| 5,422,889 | 6/1995 | Sevenhans et al. | 455/324 |

OTHER PUBLICATIONS

Cavers, J. K., et al, "Adaptive Compensation For Imbalance And Offset Losses In Direct Conversion Transceivers", Vehicular Technology, 1991 Conference. pp. 578–583.

Cavers, J. K. et al, "Adaptive Compensation For Imbalance And Offset Losses In Direct Conversion Transceivers", IEEE Transactions On Vehicular Technology, vol. 42, No. 4, 1993.

*Primary Examiner*—Chi H. Pham
*Attorney, Agent, or Firm*—Susan L. Lukasik

[57] ABSTRACT

A zero-IF transmitter (200) has a DC offset, representative of a carrier feedthrough signal. A value to correct the DC offset is successively approximated (207). A summer (201) adds the value to a desired input to reduce the DC offset.

20 Claims, 2 Drawing Sheets

- PRIOR ART -

DC OFFSET REDUCTION IN A ZERO-IF TRANSMITTER

FIELD OF THE INVENTION

This invention relates to radio frequency (RF) transmitters, including but not limited to DC (direct current) offset reduction in an RF transmitter.

BACKGROUND OF THE INVENTION

Modern communication systems are more commonly using linear modulation techniques due to the high spectral efficiency these techniques provide. The complexity of the modulator and tolerances required often require formulation of the RF signal in its baseband equivalent by a digital signal processor. Hence, baseband to RF conversion is required. Because linear modulation is employed, a linear power amplifier (PA) is required. A well known method for creating a linear RF PA is to employ feedback. Because the input to the transmitter is a baseband signal, it is convenient to down convert the RF signal to baseband with the same local oscillator as the up mixer in order to complete the feedback loop. A simplified version of such a system is shown in FIG. 1.

DC offsets are inherent, undesirable outputs or inputs of active analog active circuitry. Offsets occur in amplifiers from the inability to perfectly match components. The problem is compounded by component variation over temperature.

FIG. 1 illustrates various DC offsets that are inherently present in a baseband feedback transmitter. DC offsets result in a spectral term at the frequency of the local oscillator at the output of the system, and are often referred to as carrier feedthrough. Also shown in its equivalent form is direct local oscillator leakage, $b\cos(\omega t+\phi)$, into the RF path. This leakage can result from RF coupling from the mixer's local oscillator input to the mixer's output and is represented by the local oscillator signal reduced in amplitude by a factor b and phase shifted by a term $\phi$. If the modulation system is designed to be a carrier suppressed system, carrier feedthrough of a sufficient magnitude will result in system performance degradation. DC offsets are typically temperature dependent, hence, adaptive means are often used to help reduce them. FIG. 1 shows three offsets, $V_1$, $V_2$, and $V_m$. $V_1$ represents an equivalent DC offset for offsets from the downmixer, the amplifier with gain B, and offsets appearing at the input, X, of the main summer 101. $V_2$ represents the DC offset of the amplifier with gain $A_1$. $V_m$ represents the DC offset of the upmixer. DC offsets are usually not accessible at the output of the equivalent summer, however, they can be observed at the output of the amplifier the summer is connected with.

A spectral term at the frequency of the local oscillator at the output of the system can cause a number of problems, including increased splatter at turn-on or turn-off for Time Division Multiple Access (TDMA) systems, degraded performance from the demodulated signal, and degraded efficiency of the PA due to an extra signal. The effects of the DC offset are especially a problem for a zero-IF (Intermediate Frequency) transmitter, because the carrier is inband and filtering cannot generally be used to eliminate the carrier. Adding a fixed amount of DC to reduce carrier feedthrough is well known.

Accordingly, there is a need for a linear zero-IF transmitter with DC offset reduction such that carrier feedthrough is minimized.

DESCRIPTION OF A PREFERRED EMBODIMENT

The following describes an apparatus for and method of reducing DC offsets in a linear zero-IF transmitter. While a baseband feedback zero-IF transmitter is in open loop operation, a successive approximation algorithm is used to nullify the DC offset of the transmitter.

Figure 1:
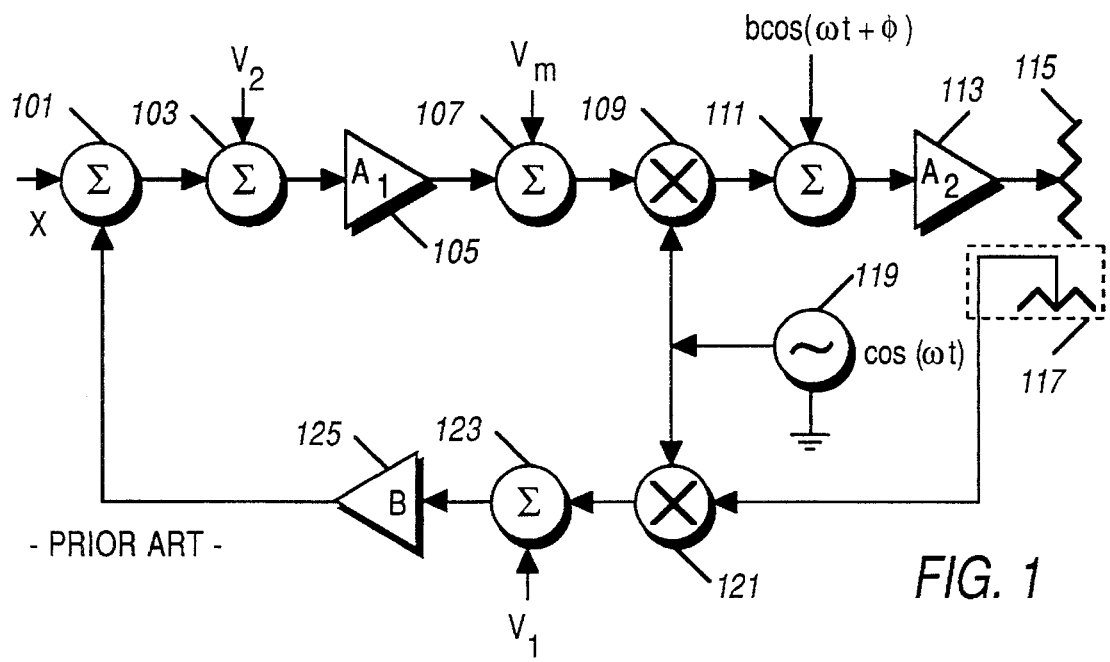
FIG. 1 is a block diagram showing DC offsets in a baseband feedback transmitter.
Figure 2:
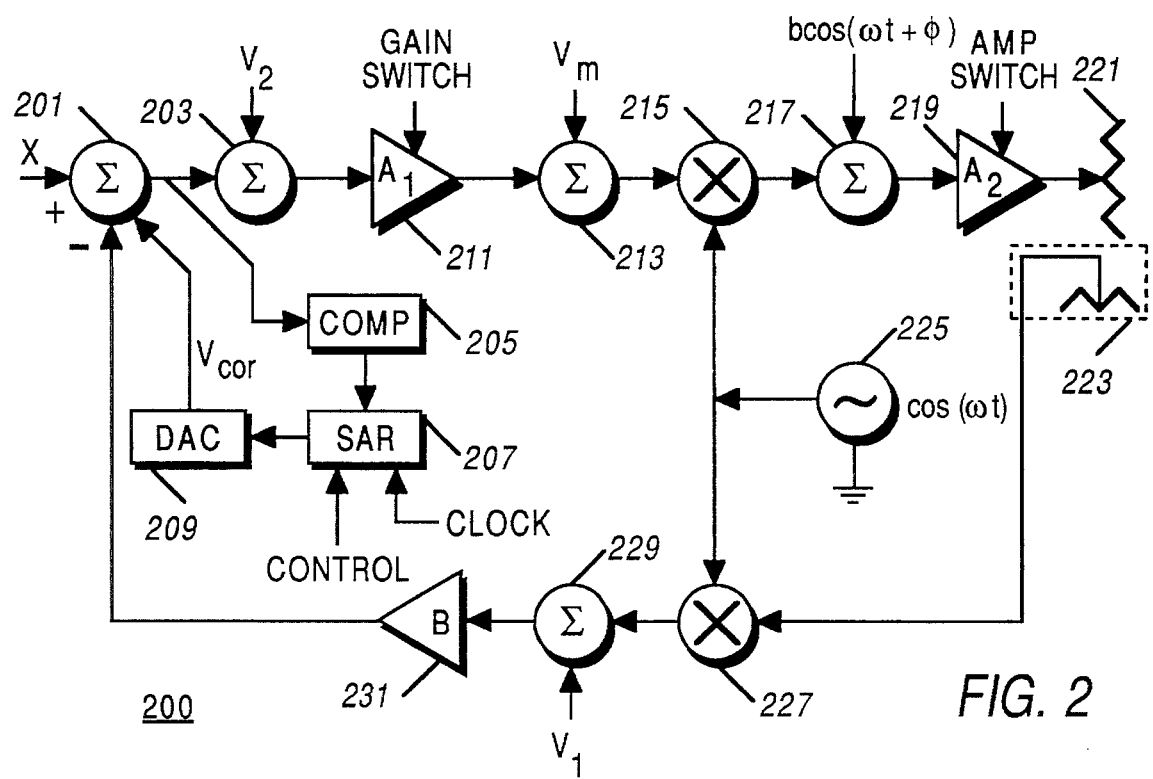
FIG. 2 is a TDMA baseband feedback transmitter with DC offset reduction in accordance with the invention.

DC offset reduction in a TDMA baseband feedback transmitter is shown in FIG. 2. Input data, X, enters a first summer 201. The output of the first summer 201 is input to a second summer 203, which has another input of $V_2$, which represents the DC offset of the amplifier with gain $A_1$. The output of the first summer 201 is input to a conventional comparator 205. The output of the comparator 205 is input to a successive approximation register (SAR) 207. The output of the SAR 207 is input to a digital to analog converter (DAC) 209. The function of the SAR 207 is described below in the paragraphs following the current paragraph. The output of the DAC 209 is the signal $V_{cor}$ which is coupled to an input of the first summer 201. At this time, the transmitter amplifier is run open loop by reducing the gain of a first amplifier 211 to zero via a gain switch input. The output of the second summer 203 is input to the first amplifier 211 with gain $A_1$. The output of the first amplifier 211 is input to a third summer 213, which has another input of $V_m$, where $V_m$ represents the DC offset of the upmixer. The output of the third summer 213 is input to a mixer 215. The other input to the mixer 215 is the signal $\cos(\omega t)$ from a local oscillator 225. The output of the mixer 215 is input to a fourth summer 217, which has carrier leakage $b\cos(\omega t+\phi)$. The output of the fourth summer 217 is input to a second amplifier 219 which has gain $A_2$. For TDMA systems, a switch is often used to essentially cut off the second amplifier 219 by significantly reducing its gain. This prevents interference to other users in the TDMA system. An amplifier switch controls the gain of the second amplifier 219 by enabling or disabling DC supply or bias signals. The output of the second amplifier 219 is input to an appropriate output element 221. A coupler 223 responsive to the output of the second amplifier 219 provides a feedback signal to a second mixer 227. The other input to the second mixer 227 is the output, $\cos(\omega t)$, of the local oscillator 225. The output of the second mixer 227 is input to a fifth summer 229, which has another input of $V_1$, where $V_1$ represents an equivalent DC offset for offsets from the downmixer, the amplifier with gain B and offsets appearing at the input of the main summer. The output of the fifth summer 229 is input to a third amplifier 231 with gain B. The output of the third amplifier 231 is coupled to the negative input terminal of the first summer 201.

The successive approximation algorithm is a well known variation of the bisection algorithm that has been used over the past few centuries for finding the roots of equations. The typical mathematical application of the algorithm proceeds by initially finding a value of the independent variable x that forces the output f(x) close to zero. This is typically done graphically or by trial and error. Next, a step size, Δx, is chosen such that the new root approximation formed by adding or subtracting Δx from the original estimate forces f(x) to change signs. The sign change is very important since this indicates that the root must lie between the original estimate and the original estimate +/−Δx. The value of x is always modified in a direction that will force sign change of f(x). The first new estimate is formed by adding/subtracting Δx/2 to/from the original estimate. The sign of f(x) is then checked with this new approximation, and Δx is then divided by four. The next approximation is formed by adding/subtracting, depending on the sign of the output, the value Δx/4 to the previous approximation formed by using Δx/2. This process continues until the root is bounded within the desired degree.

Differential amplifiers are often used as building blocks on analog ICs (integrated circuits). The output of a differential amplifier, when observed as the difference between two output ports, has the ability to change polarity. Hence, the output must be zero for some input value. The typical desired output, when no desired signal is present, is zero. A practical amplifier has an non-zero output with no desired signal present due to DC offsets. Because the output of the amplifier can be forced to zero by an appropriate input, the output resulting from a DC offset can be forced to zero by applying the appropriate input value (assuming a linear amplifier). The characteristics of the amplifier's output are analogous to the function f(x) described above for values of x near a root. Hence, the successive approximation algorithm can be used to force the output to approximately zero.

The electronic control circuitry that performs the successive approximation algorithm is referred to as a Successive Approximation Register (SAR). These registers are often characterized by the number of bits available, e.g., an eight bit SAR. The accuracy of the approximation is directly proportional to the number of bits available. For the application of reducing DC offsets, the output of the SAR forms the input to a DAC that generates a DC voltage that is capable of swinging the output of the amplifier about zero +/−ΔV. The value ΔV must be large enough to accommodate temperature and manufacturing tolerances. It should be noted that the required magnitude of this voltage must be known before circuit realization. This differs somewhat from the first step of the previously described mathematical application since the value of Δx was established from a step in the algorithm.

Because the successive approximation algorithm needs only to know the sign (polarity) of the output, a simple conventional comparator is used. The output of the comparator 205 forms an input to the SAR 207 in order to inform the device whether or not a polarity change has occurred. A logic signal, CONTROL, informs the SAR 207 to start (typically by a rising or falling edge). Next, typically on the rising or falling edge of a clock input to the SAR 207, the SAR 207 generates an output code that will force the output of the DAC 209 to half scale, e.g. the binary code 10000000 for an eight bit SAR 207. The output of the DAC 209 then is added with the equivalent input offset voltage of the amplifier, and the amplifier's output polarity is checked. Whether the most significant bit of the output code is latched as logical "1" or "0" is determined by the polarity. Latching typically is triggered by the opposite edge of the clock (opposite edge with respect to the edge that generated the code given in the above example). On the next clock cycle, the code x1000000 will be generated, and the sequence is repeated. The value x is determined as described above. This operation, for an eight bit SAR 207, continues for eight clock cycles, then is terminated. The output code after termination is a code that will have forced the output of the DAC 209 to a value that forces the output of the second summer 203 as close to zero as possible with a signal that is quantized to n bits (eight bits for the above example). Thus, the SAR approach provides a method of quickly reducing the offset at the main summer due to $V_1$ to approximately zero.

Figure 3:
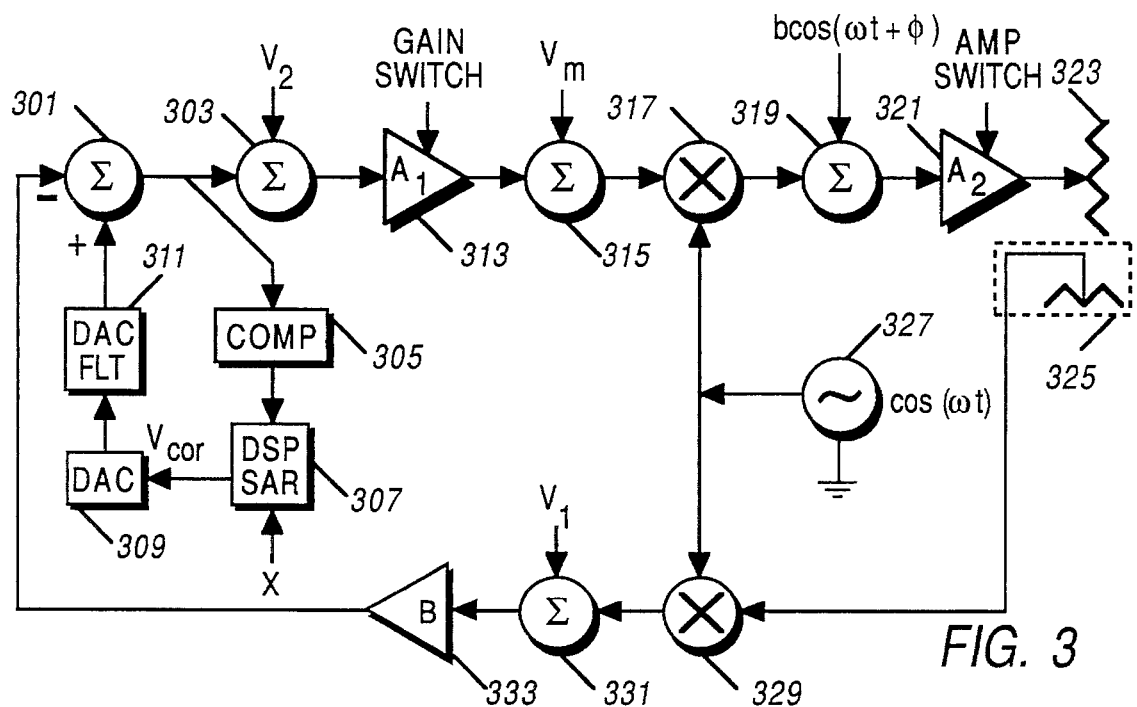
FIG. 3 is a TDMA baseband feedback transmitter with DC offset reduction performed by a DSP in accordance with the invention.

A TDMA baseband feedback transmitter with DC offset reduction performed by a DSP is shown in FIG. 3. The feedback from an amplifier 333 is input to the negative terminal of a first summer 301. The output of the first summer 301 is input to a second summer 303. Offset $V_2$ is also input to the first summer 301 is. The output of the second summer 303 is input to a comparator 305, as described for FIG. 2, and the output of the comparator 305 is input to a DSP (Digital Signal Processor) SAR 307. Input data, X, is also input to the DSP SAR 307. The output of the DSP SAR 307 is the signal $V_{cor}$, which is input to a DAC 309. The output of the DAC 309 is input to a DAC filter 311, the output of which is coupled to the positive input terminal of the first summer 301. The remaining elements of FIG. 3, 313, 315, 317, 319, 321, 323, 325, 327, 329, 331, 333, perform the same functions as the equivalent elements of FIG. 2, 211, 213, 215, 217, 219, 221, 223, 225, 227, 229, and 231, as previously described. This implementation shows a DSP type implementation for the SAR. The DSP may also be used for other processing functions.

The need to reduce offsets quickly is a requirement typical of a TDMA system. In a TDMA system, transmissions take place periodically only in assigned time slots and in short bursts. It is beneficial to be able to check the status of the carrier feedthrough at this rate, and the SAR approach provides a method of quickly reducing the offset. Because other subscriber units may be transmitting in other time slots, but on the same frequency, the system shown in FIG. 2/FIG. 3 is advantageous because the unit is not transmitting RF when the offset is being corrected. Thus, the correction factor, $V_{cor}$ is determined while the transmitter is in open loop, i.e., not transmitting, as during the time slots that are not assigned to the particular transmitter. One of skill in the art would recognize that the present invention need not be embodied only in a TDMA system. The invention works equally well in a system in which the transmitter is permitted to turn off for at least a short period of time.

Figure 4:
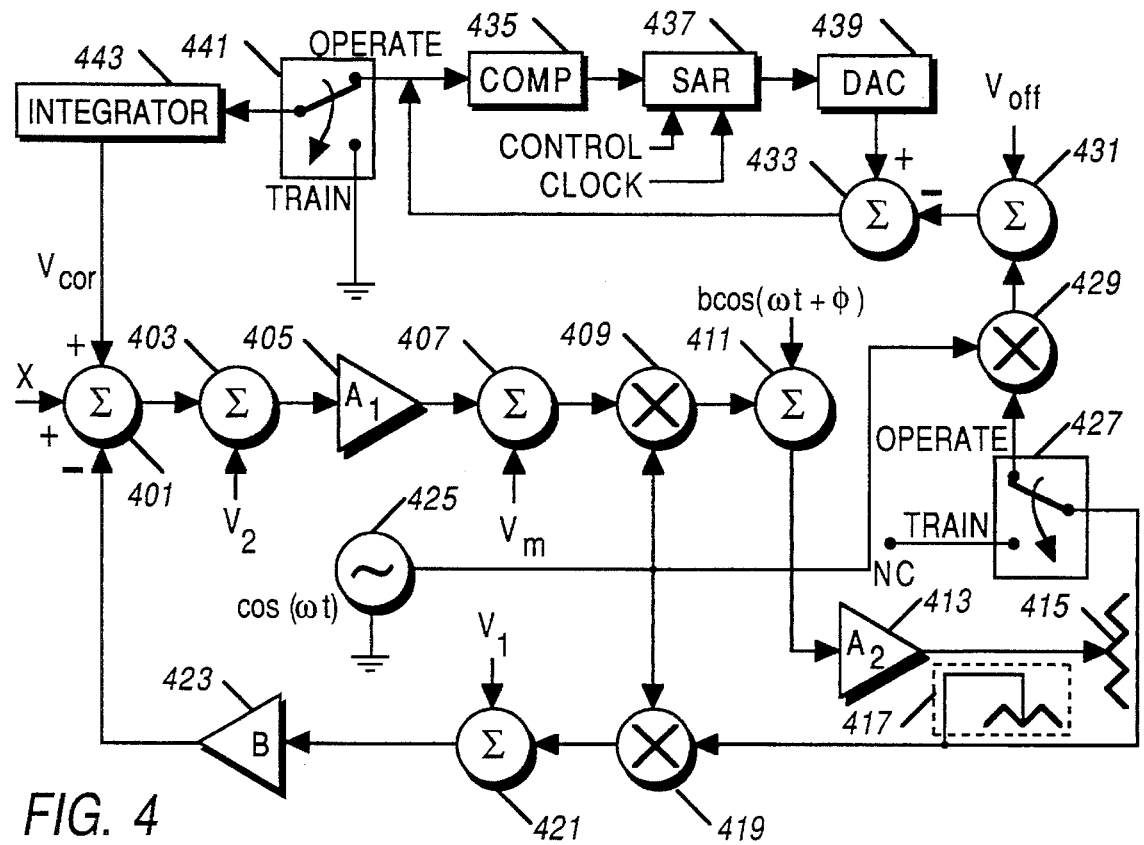
FIG. 4 is a continuous-transmission baseband feedback transmitter with DC offset reduction in accordance with the invention.

A continuous-transmission baseband feedback transmitter with DC offset reduction is shown in FIG. 4. Data, X, is input to a first summer 401, the output of which is input to a second summer 403. Offset $V_2$ is also input to the second summer 403, the output of which is input to a first amplifier 405 with gain $A_1$. The output of the first amplifier $A_1$ is input to a third summer 407. Offset $V_m$ is input to the third summer 407, the output of which is input to a first mixer 409. A local oscillator 425 outputs the signal cos(ωt) to the first mixer 409, a second mixer 419, and a third mixer 429. The output of the first mixer 409 is input to a fourth summer 411. Local oscillator leakage, bcos(ωt+φ), is also input to the fourth summer 411, the output of which is input to a second amplifier 413 with gain $A_2$. The output of the second amplifier 413 is input to an appropriate output element 415, such as an antenna. A coupler 417 is responsive to the output of the second amplifier 413 and provides a feedback signal to the second mixer 419, which has a gain of one. The output of the second mixer 419 is input to a fifth summer 421.

Offset $V_1$ is also input to the fifth summer 421, the output of which is input to a third amplifier 423 with gain B. The output of the third amplifier 423 is coupled to the negative input terminal of the first summer 401.

A switch 427 switches in one input to the third mixer 429. The switch 427 alternates between a train sequence and a feedback path from the coupler 417. The output of the third mixer 429 is input to a sixth summer 431. The offset $V_{off}$, which signal represents DC offset of the third mixer 429, is also input to summer 431, the output of which is input to the negative input terminal of a seventh summer 433. The output of the seventh summer 433 is input to a conventional comparator 435. The output of the comparator 435 is input to an SAR 437, the output of which is input to a DAC 439. The output of the DAC 439 is coupled to the positive input terminal of the seventh summer 433. The output of the seventh summer 433 is input to one position of a second switch 441. The other position of the second switch 441 is grounded. The output of the second switch 441 is input to an integrator 443, which outputs the signal $V_{cor}$ to a positive input terminal of summer 401. When the switch 441 is attached to the output from seventh summer 433, DC offset correction is performed. When the switch 441 is in the grounded position, the DC offset correction circuit is calibrated using training, and no correction is added to the transmitter circuit via the integrator 443.

The system of FIG. 4 can continue to transmit while its carrier feedthrough is being nulled. The transmitter can continue to transmit while calibration of the offset correction circuit (427, 429, 431, 433, 435, 437, and 439) is operating during training without causing off-channel interference. Unlike the system of FIG. 2/FIG. 3 where nulling is performed at baseband, the closed loop requirement forces the nulling to be performed effectively at RF. By observing the RF signal of the transmitter at its desired output, the problems of resolving DC offsets in closed loop systems do not exist. The system is easily implemented on an IC by using the mixer shown at the input of the integrator. The system functions by utilizing the fact that the integrator's output stops changing only when the input is equal to zero. When the input to the integrator is zero, however, ideally the carder feedthrough has also been reduced to zero. The degree to which the circuit is capable of nulling the carrier is limited to DC offsets. The source of the largest and most variable of these offsets is the third mixer 429. This offset can be eliminated by applying training as shown in FIG. 4. During training, the first switch 427 selects the training position, and the second switch 441 is grounded. Then, the switches are changed to the operate position, and the first switch 427 selects the coupler 417 signal, and the second switch selects the correction factor from the seventh summer 433. The training position sets the RF input to the third mixer 429 to zero, thus its output consists only of the offset $V_{off}$. By forming a loop consisting of a comparator, an SAR, and a DAC, a correction term can be formed to reduce the mixers offset to zero. The SAR will store this value until the next training period. While the circuit is training, the correct value of the integrator's 443 output must still be input to the main circuit in order to maintain the carrier feedthrough with tolerable limits. This is accomplished by forcing the input to the integrator to equal zero as shown by the second switch 441. Two nulling circuits are needed if the system uses in-phase, I, and quadrature, Q, channels. Also required are two local oscillator signals, in-phase quadrature.

What is claimed is:

1. An apparatus comprising:

a zero-IF transmitter having a feedback loop and having a DC offset, representative of a carrier feedthrough signal;

a successive approximation register, operatively coupled to the zero-IF transmitter, arranged and constructed external to the feedback loop to successively approximate a value to correct the DC offset; and a summer, within the feedback loop of the zero-IF transmitter and operatively coupled to the successive approximation register, for adding the value to a desired input to reduce the DC offset.

2. The apparatus of claim 1, wherein the successive approximation register is implemented in a digital signal processor.

3. The apparatus of claim 1, wherein the successively approximating is performed when the feedback loop of the zero-IF transmitter is open.

4. The apparatus of claim 1, wherein the successively approximating is performed when the zero-IF transmitter transmits in closed-loop operation, thus preventing off-channel interference.

5. The apparatus of claim 1, wherein the adding is performed when the feedback loop of the zero-IF transmitter is closed.

6. The apparatus of claim 1, wherein the successive approximation register provides adaptive correction of DC offset.

7. A method of correcting DC offset in a zero-IF transmitter, comprising the steps of:

opening a feedback loop in the zero-IF transmitter;

successively approximating a value to correct the DC offset; and adding the value to a desired input to reduce the DC offset.

8. The method of claim 7, wherein the step of successively approximating is performed in a digital signal processor.

9. The method of claim 7, further comprising the steps of closing the feedback loop and successively approximating when the feedback loop of the zero-IF transmitter is closed, thus preventing off-channel interference.

10. The method of claim 7, wherein the step of adding is performed when the feedback loop of the zero-IF transmitter is closed.

11. The method of claim 7, wherein the step of successively approximating provides adaptive correction of DC offset.

12. A method of correcting DC offset in a zero-IF transmitter, comprising the steps of:

in a transmitter having a feedback loop and at least one amplifier in a forward path of the feedback loop, opening the feedback loop by driving the at least one amplifier's gain to substantially zero;

successively approximating a value to correct the DC offset;

closing the feedback loop by driving the at least one amplifier's gain to a nominal operating value.

13. The method of claim 12, wherein the output of the zero-IF transmitter is effectively zero when in the feedback loop is open, and whereby the step of successively approximating further comprises the step of comparing a successive estimate of unwanted DC offset with measured DC offset in the forward path of the feedback loop.

14. The method of claim 13, wherein the successive estimate is added to a desired input to reduce the DC offset to substantially zero.

15. An apparatus comprising:

a zero-IF transmitter having a DC offset and having a feedback loop that has a return path;

a summer, within the feedback loop of the zero-IF transmitter, having a first summer input coupled to an input signal, a second summer input coupled to the return path of the feedback loop , a third summer input and a summer output;

a successive approximation register (SAR), having an SAR input operatively coupled to the summer output and an SAR output operatively coupled to the third summer input wherein the SAR is arranged and constructed to successively approximate a value to reduce the DC offset.

16. The apparatus of claim 15, wherein the SAR successively approximates when the feedback loop of the zero-IF transmitter is open.

17. The apparatus of claim 15, wherein the SAR successively approximates when the zero-IF transmitter transmits in closed-loop operation, thus preventing off-channel interference.

18. The apparatus of claim 15, wherein the summer performs when the feedback loop of the zero-IF transmitter is closed.

19. The apparatus of claim 15, wherein the SAR is arranged and constructed to adaptively correct DC offset.

20. A method of correcting DC offset in a zero-IF transmitter having a Cartesian feedback loop and a training feedback loop, comprising the steps of:

opening the training feedback loop in the zero-IF transmitter;

successively approximating a value to correct the DC offset within the training feedback loop;

adding the value to attenuate the DC offset within the training feedback loop;

closing the training feedback loop in the zero-IF transmitter; and integrating DC offset within the Cartesian feedback loop, thereby attenuating the DC offset within the Cartesian feedback loop.

* * * * *